United States Patent [19]

Hayashi

[11] Patent Number: 4,870,664
[45] Date of Patent: Sep. 26, 1989

[54] CONTINUOUS COUNTING DEVICE
[75] Inventor: Mishio Hayashi, Ohsato, Japan
[73] Assignee: Advantest Corporation, Tokyo, Japan
[21] Appl. No.: 220,309
[22] Filed: Jul. 18, 1988
[30] Foreign Application Priority Data
  Jul. 27, 1987 [JP] Japan ................................. 62-188387
[51] Int. Cl.$^4$ ...................... H03K 21/38; H03K 21/40
[52] U.S. Cl. ......................................... 377/44; 377/20;
  377/28; 377/52; 377/107; 328/72; 328/129.1
[58] Field of Search .................. 328/63, 72, 75, 129.1,
  328/130.1; 377/20, 28, 44, 52, 112, 107
[56] References Cited
  U.S. PATENT DOCUMENTS
  3,680,116  7/1972  Rademacher et al. ............ 328/130.1
  3,808,407  4/1974  Ratz ........................................ 377/44
  3,936,745  2/1976  Harrington ......................... 328/129.1
  4,001,699  1/1977  Denny et al. .......................... 328/72
  4,151,404  4/1979  Harrington et al. .................. 377/44

Primary Examiner—John S. Heyman
Attorney, Agent, or Firm—Staas & Halsey

[57] ABSTRACT

Sampling pulses for determining a series of measurement periods are each synchronized, by a synchronizing circuit, with one of a plurality of input signal pulses to be measured. A first counter responds to the synchronized sampling pulse to start the counting of the input signal pulses. When the first counter has counted a predetermined number M of input signal pulses, a second counter starts counting the input signal pulses at the initial value M and stops the counting in response to the next synchronized sampling pulse. The count value of the second counter is applied to a display during the next counting of the input signal pulses by the first counter up to the predetermined number.

10 Claims, 3 Drawing Sheets 4,870,664

CONTINUOUS COUNTING DEVICE

BACKGROUND OF THE INVENTION

The present invention relates to a continuous counting device which continuously repeats counting of input signal pulses incoming at irregular intervals in a predetermined counting period.

FIG. 1 is a block diagram showing, by way of example, the arrangement of a conventional counting circuit. When supplied with a reference clock from a reference clock source 11, a gate control circuit 12 frequency divides the reference clock and provides a gate signal B of a predetermined length to one input terminal of an AND gate 13. Input signal pulses C to be counted are applied to the other input terminal of the AND gate 13. While being supplied with the gate signal B from the gate control circuit 12, the AND gate 13 provides at its output terminal input signal pulses D to be counted, which are applied to a clock input terminal T of a counter 14. The counter 14 counts the input signal pulses D and, at the same time, provides the count value to a temporary storage register 15.

Having completed frequency dividing a predetermined number of reference clocks, the gate control circuit 12 stops outputting the gate signal B. Consequently, the AND gate 13 is disabled, cutting off the supply of the input signal pulses C to the counter 14. The gate signal B is applied to an end pulse generator 16 as well. Upon discontinuation of the supply of the gate signal B, the end pulse generator 16 generates and applies an end pulse E to the temporary storage register 15 and a reset pulse generator 17. By the leading edge of the end pulse E the temporary storage register 15 inputs thereinto the current count value output of the counter 14 and provides it to a display 18 for display thereon. On the other hand, the reset pulse generator 17 yields a reset pulse A at the timing of the trailing edge of the end pulse E and provides it to the gate control circuit 12 and the counter 14. When supplied with the reset pulse A, the counter 14 is cleared to zero and the gate control circuit 12 is reset to its initial state for the frequency dividing operation. That is to say, the control circuit 12 resumes the outputting of the gate signal B and newly starts the frequency dividing of the reference clock. Upon completion of the predetermined frequency dividing operation, the gate signal B is made low-level. By repeating the above operation input signal pulses incoming in the counting period are counted and the count value is displayed.

FIG. 2 shows a series of waveforms, for explaining an example of the operation of the counting device depicted in FIG. 1.

When supplied with the reset pulse (A-①) from the reset pulse generator 17, the gate control circuit 12 provides the gate signal B (B-①) and, at the same time, starts the frequency division of the reference clock (not shown in FIG. 2). While being supplied with the gate signal B (B- 2 ), the AND gate 13 outputs at its output terminal the input signal pulses C applied to the other input terminal and applies them as pulses D to the counter 14. The counter 14 counts the supplied signal pulses D.

When the gate control circuit 12 completes the frequency dividing operation and stops the generation of the gate signal B-③), the end pulse generator 16 immediately generates the end pulse E (E-①). By the leading edge of the end pulse E the count value of the counter 14 is read into the temporary storage register 15, through which it is provided to the display 18 for display thereon as display F. On the other hand, the reset pulse generator 17 generates the reset pulse A (A-②) by the trailing edge of the end pulse E. The reset pulse A clears the counter 14 to zero and causes the gate control circuit 12 to re-supply the gate signal B (B-④) to the AND gate 13.

As described above, according to the conventional counting device, the period during which the frequency-divided output of the gate control circuit 12, that is, the gate signal is output therefrom is the counting operation period of the counter 14, during which input signal pulses supplied thereto via the AND gate 13 are counted and which is followed by the display operation period in which the count value N1 obtained in the counting period is read into the temporary storage register 15 and is then displayed on the display. Then, in the next subsequent counting operation period input signal pulses are counted again and the count value N2 obtained in the counting operation period is displayed in the next subsequent display operation period.

As will be appreciated from the above, according to the prior art counting device, the counting operation period is predetermined, the input signal pulses incoming in the counting operation period are counted, and upon completion of the counting period, the display period is initiated in which to display the count value obtained in the counting period, followed by the next counting period for newly counting input signal pulses. Accordingly, no count is taken of the number of input signal pulses which are applied in the time interval occurring between individual counting operation periods, that is, during the display operation period, thus resulting in discontinuous countings.

For example, where an input signal pulse of a particularly low frequency of occurrence happens to be applied in the display operation period, such a rare incoming pulse cannot be seized and an opportunity of collecting such valuable data is lost; accordingly, it is impossible to obtain an accurate continuous count value of data.

SUMMARY OF THE INVENTION

It is therefore an object of the present invention to provide a continuous counting device which permits counting all incoming input signal pulses and displaying the count value of the pulses for each measuring period.

The continuous counting device of the present invention is made up of: a synchronizing circuit by which sampling pulses for determining a display interval are synchronized with input signal pulses; a flip-flop circuit which is supplied, as a trigger pulse, with the output pulse of the synchronizing circuit; a first counter which is released from the reset state by the output of the flip-flop circuit and, upon counting a predetermined number M of incoming input signal pulses, provides a trigger signal to the flip-flop circuit; a gate signal generator which generates a gate signal for a period of time from the outputting of the first counter to the occurrence of the next output pulse of the synchronizing circuit; a second counter which counts incoming input signal pulses for the duration of the gate signal; a first pulse generator which is driven by the output of the flip-flop circuit and yields a pulse after a predetermined period of time; a latch circuit which latches the count value of the second counter with the output of the first pulse generator; a display which displays the output of the latch circuit; and a second pulse generator which is driven by the output of the first pulse generator to preset the predetermined number M in the second counter.

With the arrangement of the present invention, a predetermined number of input signal pulses incoming during the display operation period are counted by the second counter and the display operation period is switched to the counting operation period in accordance with the application of the input signal pulse. The count value obtained in the display operation period, that is, a predetermined count value, is added to the count value of input signal pulses counted in the next counting operation period.

DESCRIPTION OF THE PREFERRED EMBODIMENTS

Figure 1:
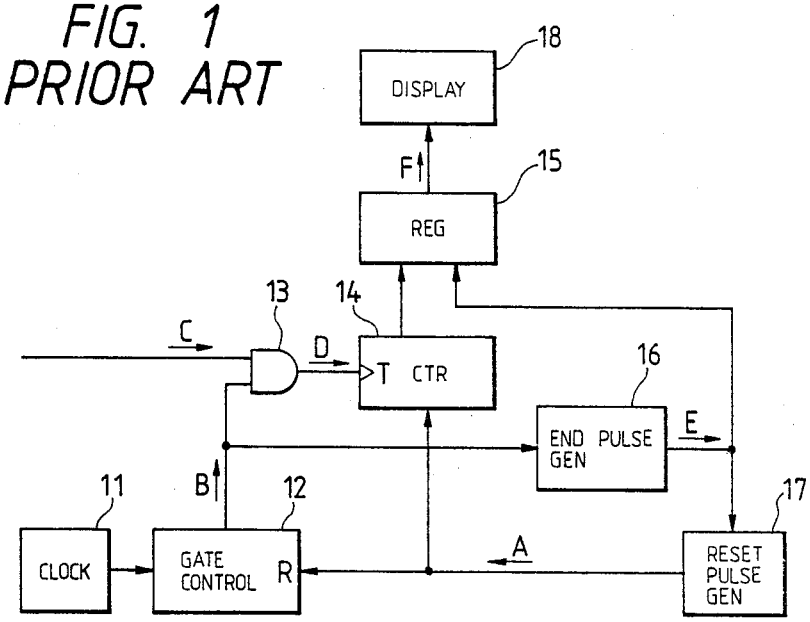
FIG. 1 is a block diagram of an example of a conventional counting device.
Figure 2:
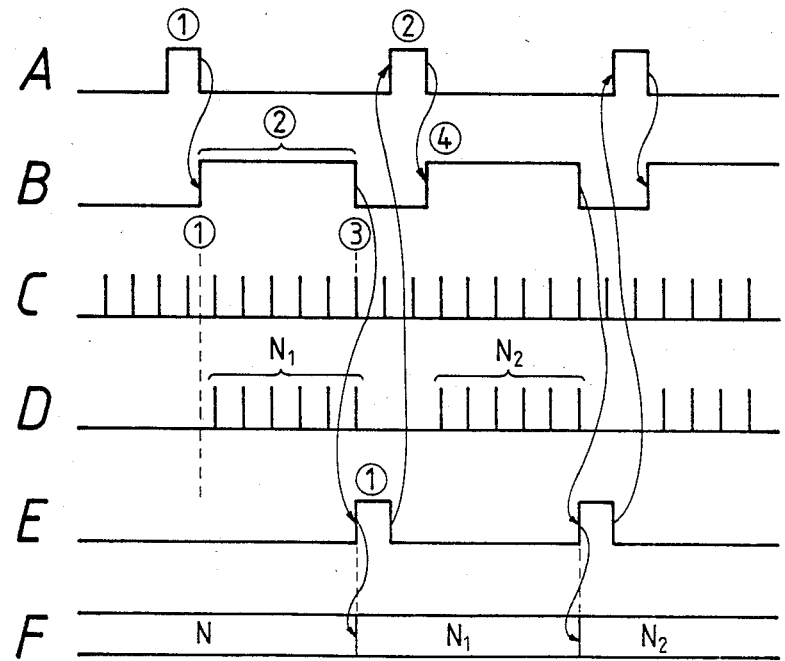
FIG. 2 is a timing chart for explaining an example of the operation of the conventional counting device of FIG. 1.
Figure 3:
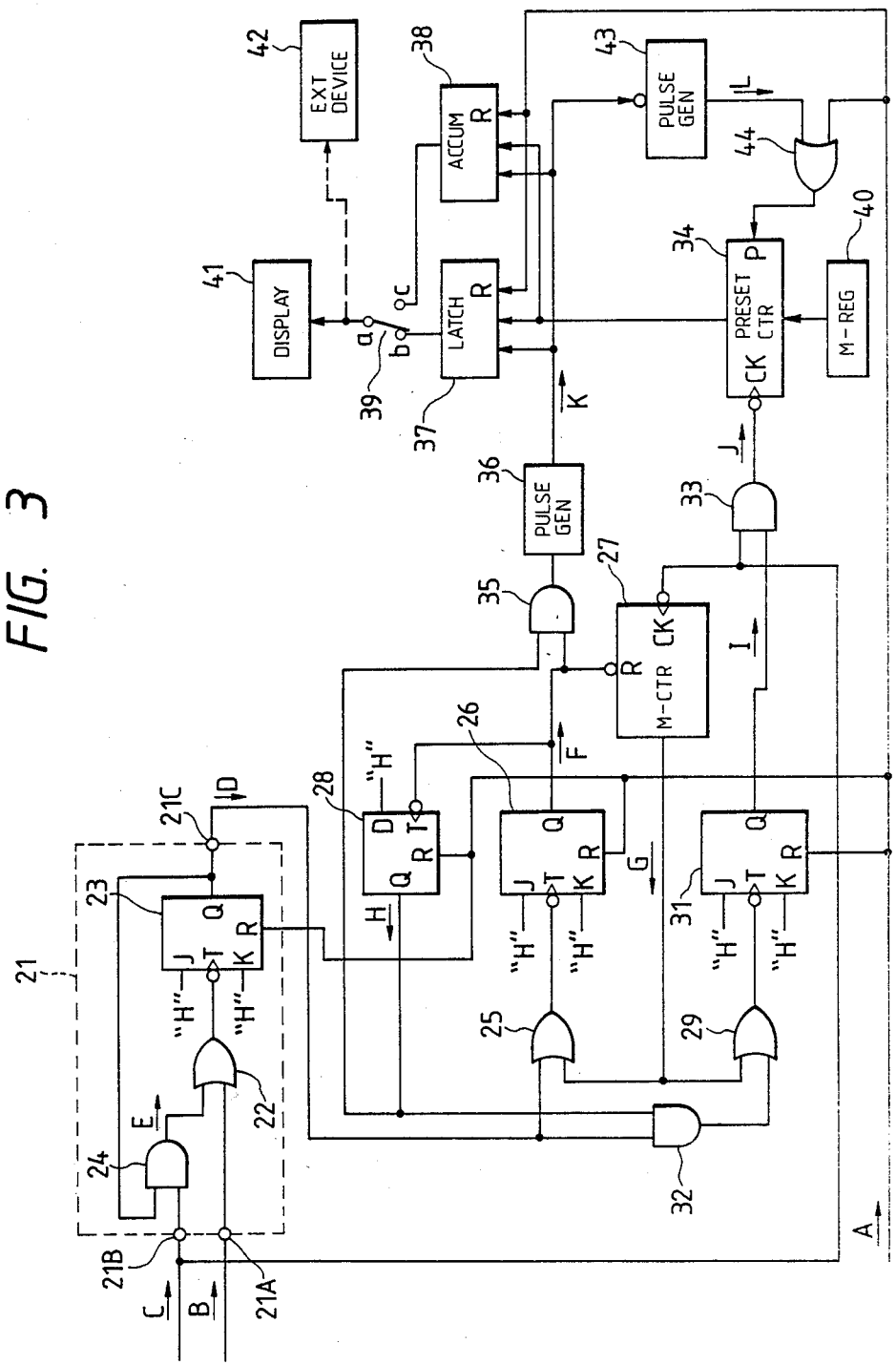
FIG. 3 is a circuit diagram of an embodiment of the circuit arrangement of the continuous counting device of the present invention.

FIG. 3 is a circuit diagram of an embodiment of the continuous counting device of the present invention. A sampling pulse B for displaying a count value is applied to an input terminal 21A of a synchronizing circuit 21, and at the same time an incoming input signal pulse C is provided to a synchronizing signal input terminal 21B. The synchronizing circuit 21 provides at its synchronized output terminal 21C an output pulse D produced by synchronizing the fall of the sampling pulse B with the input signal pulse C. In this embodiment the synchronizing circuit 21 comprises an OR gate 22, a flip-flop circuit 23 and an AND gate 24.

With the arrangement of the synchronizing circuit 21, incoming input signal pulses C are counted and the sampling pulse B for determining the timing for displaying the count value is provided to a trigger terminal T of the J-K flip-flop circuit 23 via one input terminal of the OR gate 22. The J and K terminals of the flip-flop circuit 23 are both held high-level, and upon each application of the trigger signal to the trigger terminal T the level of the output D at the output terminal Q is reversed in synchronism with the fall of the trigger signal. The output D of the flip-flop circuit 23 is derived, as the synchronized output pulse D, from the output terminal 21C of the synchronizing circuit 21, and at the same time it is supplied to one input terminal of the AND gate 24 in the synchronizing circuit 21. The other input terminal of the AND gate 24 is supplied with the input signal pulse C and its output E is applied to the trigger terminal T of the flip-flop circuit 23 via the other input terminal of the OR gate 22.

The output pulse D provided in synchronism with the input signal pulse C is applied via an OR gate 25 to a trigger terminal T of a J-K flip-flop circuit 26. The flip-flop circuit 26 holds its J and K terminals high-level and reverses its Q output F by the trigger signal.

The output F of the flip-flop circuit 26 is provided to a reset terminal R of a counter 27. When the reset terminal R is low-level, the counter 27 remains in the reset state, in which it cannot count input signal pulses C which are provided to its clock terminal CK.

When the output F of the flip-flop circuit 26 is made high-level and consequently the signal to the reset terminal R of the counter 27 goes to high, the counter 27 is released from the reset state and hence is allowed to perform the counting operation, thus starting the counting of input signal pulses C. Having counted the predetermined number M of input signal pulses C, the counter 27 provides a trigger signal G via the OR gate 25 to the flip-flop circuit 26. As a result of this, the output F of the flip-flop 26 is inverted again to the low level, resetting the counter 27.

The output F of the flip-flop circuit 26 is applied to a trigger terminal T of a D flip-flop circuit 28 as well. Responsive to the trigger input which is provided when the output F changes from the high level to the low level, the flip-flop circuit 28 yields a high-level initialization end signal H.

The trigger signal G from the counter 27 is applied via an OR gate 29 to a gate signal generator 31 as well. In this embodiment the gate signal generator 31 is formed by a J-K flip-flop circuit. A gate signal I which the flip-flop circuit 31 produces, is controlled to be high-level by the trigger signal G from the counter 27. The output pulse D from the synchronizing circuit 21 is also provided via an AND gate 32 to the flip-flop circuit 31, and the gate signal I is inverted to the low level by the output pulse D.

The gate signal I is applied to one input terminal of an AND gate 33, to the other input terminal of which are applied the input signal pulses C. While the gate signal I is kept high, that is, while it acts as an enable signal, the AND gate 33 yields at its output terminal signal pulses J, which are provided to a presettable counter 34 and counted therein.

On the other hand, the output F of the flip-flop circuit 26 is applied to one input terminal of an AND gate 35. While the initialization end signal H from the flip-flop circuit 28 is being kept high and applied to the other input terminal of the AND gate 35, the output F of the flip-flop circuit 26 is provided via the AND gate 35 to a pulse generator 36. The pulse generator 36 is a one-shot multivibrator, which responds to the output F of the flip-flop circuit 26 to output a counting end pulse K of a fixed width $\tau_K$, which is supplied to a latch circuit 37. The latch circuit 37 responds to the counting end pulse K to latch the count value of the counter 34. In this embodiment the output of the counter 34 is applied to an accumulator 38 as well. The accumulator 38 responds to the counting end pulse K to read thereinto the count value of the counter 34, accumulates it and outputs the accumulated value.

Either the count value latched in the latch circuit 37 or the accumulated value by the accumulator 38 is displayed on a display 41 through a change-over switch 39. The count value or accumulated value can also be provided to an external device 42 as required.

The counting end pulse K from the pulse generator 36 is provided to another pulse generator 43 as well. The pulse generator 43 is a one-shot multivibrator, which responds to the counting end pulse K to yield a preset pulse L of a fixed width $\tau_L$. The preset pulse L is applied via an OR gate 44 to the counter 34. By the preset pulse L a value M held in a register 40 is set, as an initial value, in the counter 34, making it ready for counting the incoming pulses J which are supplied thereto from the AND gate 33 during the next counting period.

According to the present invention, since the switching between the counting operation period and the display period takes place in synchronism with the input signal pulse, there is substantially no possibility of the above-mentioned periods being switched therebetween at the same time as the application of the input signal pulse. In other words, almost all input signal pulses will be counted which are applied not only during the display period but also at the moment of switching between the counting operation period and the display period.

Figure 4:
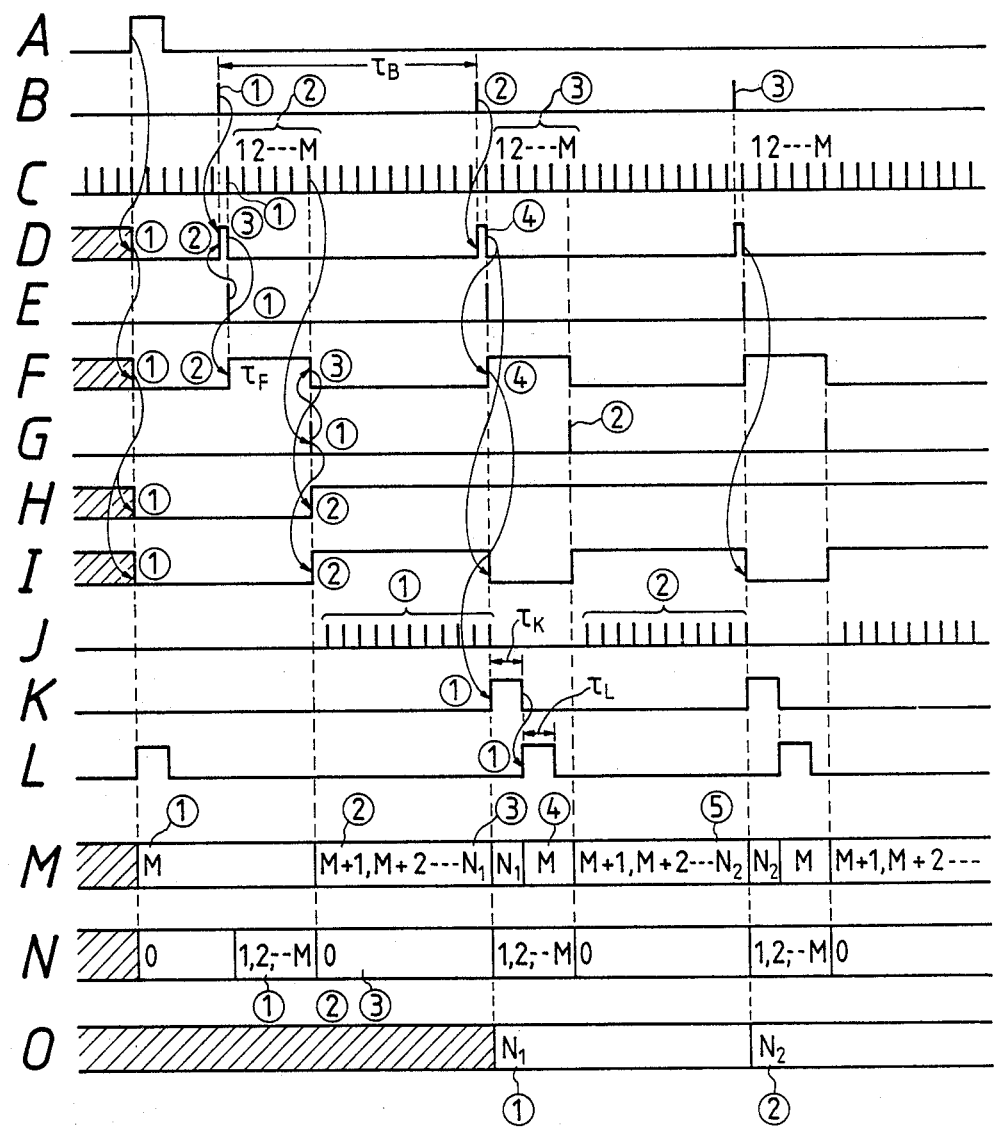
FIG. 4 is a timing chart for explaining an example of the operation of the continuous counting device depicted in FIG. 3.

FIG. 4 shows a series of waveform diagrams, for explaining an example of the operation of the continuous counting device depicted in FIG. 3. Waveforms A to L in FIG. 4 respectively correspond to the signals A to L in FIG. 3. The waveform A is a reset signal for initializing the device when power is applied to the continuous counting device.

The reset signal A is supplied to the flip-flop circuits 23, 26, 28 and 31, the counter 34 and the latch circuit 37 to initialize them. For instance, the outputs of the flip-flop circuits 23, 26, 28 and 31 will go low (waveforms D-①, F-①, H-① and I-①) and the initial value M will be set in the counter 34 (waveform M-①).

Upon application of a first shot of the sampling pulses B to the synchronizing circuit 21 (waveform B-①), the output D of the flip-flop circuit 23 will rise to the high level (waveform D-②), by which the AND gate 24 will be enabled. When the input signal pulse C (waveform C-①) incoming first after the AND gate 24 was enabled is provided to the trigger terminal T of the flip-flop circuit 23 via the AND gate 24 and the OR gate 22 (waveform E-①), the output of the flip-flop circuit 23 will fall again to the low level (waveform D-③). That is, the synchronizing circuit 21 will yield the output pulse D which falls in synchronism with the input signal pulse C.

The output pulse D is provided as a trigger signal to the flip-flop circuit 26, the output F of which rises to the high level (waveform F-②). As a result of this, the counter 27 will be released from the reset state and start the counting of the input signal pulses C which are applied to its clock terminal CK (waveform N-①). Having the predetermined number M of input signal pulses C (waveform C-②) for a period of time $\tau_F$ (waveform N-②), which varies with the input signal pulse interval, the counter 27 will produce the trigger signal G (waveform G-①), which is applied to the flip-flop circuit 26 and the gate signal generator 31. The flip-flop circuit 26 responds to the trigger signal G (waveform G-①) to make its output F low-level (waveform F-③). In consequence, the counter 27 is reset and cleared to zero, thus stopping the counting of the input signal pulses C (waveform N-③). On the other hand, the output I of the gate signal generator 31 goes high (waveform I-②), by which the AND gate 33 is enabled, and the input signal pulses C are provided therethrough to the counter 34 (waveform J-①). The counter 34 will start the counting of the input signal pulses C at the preset initial value M. That is, the counter 34 counts the input signal pulses C as M+1, M+2, ... (waveform M-②). Further, in response to the output F of the flip-flop circuit 26 which goes to low (waveform F-③) the flip-flop circuit 28 yields the high-level initialization end signal H (waveform H-②).

On the other hand, when the sampling pulse B which determines the measurement period is applied to the synchronizing circuit 21 at regular time intervals of $\tau_B$ (waveform B-②), the output pulse D (waveform D-④) synchronized with the input signal pulse C will be provided via the OR gate 25 to the flip-flop circuit 26, whose output F will rise to the high level (waveform F-④). The signal F (waveform F-④) is applied to the pulse generator 36 via the AND gate 35 which is being enabled by the initialization end signal H, and the pulse generator 36 yields the counting end pulse K of a pulse width $\tau_K$ (waveform K-①). By the counting end pulse K the count value N1 (waveform M-③) of the counter 34 is read into the latch circuit 37 and displayed on the display 41 (waveform O①).

Moreover, the pulse generator 43 generates the preset pulse L of a pulse width $\tau_L$ (waveform L-①), by which the counter 34 is set to the initial value M (waveform M-④) and hence is made ready for the next counting operation.

Furthermore, since the output F of the flip-flop circuit 26 has been inverted to the high-level signal (waveform F-④), the counter 27 is released from the reset state and resumes the counting of the input signal pulses C (waveform C-③) and then yields the trigger signal G (waveform G-②) when its count value has reached the predetermined value M. Then the counter 27 stops the counting operation but instead the counter 34 starts the counting of the signal pulses J as M+1, M+2, ... (waveform J-②). The count value N2 (waveform M-⑤) of the counter 34 is latched in the latch circuit 37 and displayed on the display 41 (waveform O-②) until the next sampling pulse B waveform B-③) is applied. After this, the same operations as described above will be repeated, by which the incoming input pulses C are counted and the count values N3, N4, ... are displayed. By turning the change-over switch 39 to the accumulator 38 side, the accumulated number of input signal pulses C applied until then can also be displayed.

Incidentally, the times $\tau_B$, $\tau_F$, $\tau_K$ and $\tau_L$ are selected so that $\tau_B > \tau_F > \tau_K + \tau_L$.

As described above, the present invention offers a continuous counting device which is capable of counting without omission, all input signal pulses which are applied during other than a predetermined counting period, and hence is free from an error in counting them. Accordingly, the present invention implements a continuous counting device which is very effective for counting pulses with high accuracy.

It will be apparent that many modifications and variations may be effected without departing from the scope of the novel concepts of the present invention.

What is claimed is:

1. A continuous counting device comprising:
   synchronization means for synchronizing a series of sampling pulses for determining a series of measurement periods with input signal pulses, and for producing an output pulse:
   flip-flop means for receiving the output pulse of said synchronizing means as a first trigger signal, and for producing an output;
   first counting means having a reset state which is released by the output of said flip-flop means, for counting a predetermined number of the input signal pulses and providing a second trigger signal to said flip-flop means;

gate signal generating means for generating a gate signal for a period of time from the generation of the second trigger signal by said first counting means to the generation of the output pulse from said synchronizing means;

first pulse generating means which is driven by the output of said flip-flop means, for yielding a first pulse;

second counting means for counting the input signal pulses while the gate signal is generated by said gate signal generating means;

latch means for latching the count value of said second counting means with the first pulse output by said first pulse generating means;

display means for displaying the output of said latch means; and second pulse generating means which is driven by the output of said first pulse generating means, for generating a second pulse, said second counting means being responsive to the second pulse to preset therein the predetermined number.

2. A continuous counting device comprising:

synchronizing means for synchronizing a series of sampling pulses for determining a series of successive measurement periods with a series of input signal pulses to be measured, and for generating a series of synchronized sampling pulses;

first counting means, responsive to one of the synchronized sampling pulses from said synchronizing means, for starting the counting of the input signal pulses and yielding a counting end signal after counting a predetermined number of the input signal pulses;

second counting means responsive to the counting end signal, for starting the counting of the input signal pulses and stopping the counting in response to the next one of the synchronized sampling pulses generated after the counting end signal; and display means for displaying a value corresponding to the count value of said second counting means.

3. The continuous counting device of claim 2, wherein said second counting means responds to the counting end signal to preset therein the predetermined number as an initial value at which the counting of the input pulse signals is started.

4. The continuous counting device of claim 3, wherein said second counting means includes:

a presettable counter;

a register, connected to said presettable counter, for holding the predetermined number; and preset pulse generating means, responsive to the counting end signal, for generating a preset pulse for presetting the presettable counter to the predetermined number held in said register.

5. The continuous counting device of claim 3, wherein said second counting means includes:

a presettable counter;

gate signal generating means for generating a gate signal for a period of time from the generation of the counting end signal to the generation of the next one of the synchronized sampling pulses generated after the counting end signal; and gate means for permitting the passage therethrough of the input signal pulses to said presettable counter while said gate means is supplied with the gate signal.

6. The continuous counting device of claim 5, wherein said second counting means further includes:

a register, connected to said presettable counter, for holding the predetermined number; and preset pulse generating means, responsive to the counting end signal, for generating a preset pulse for presetting said presettable counter to the predetermined number held in said register.

7. The continuous counting device of claim 2, wherein said display means includes:

latch means, responsive to the counting end signal, for latching therein the count value of said second counting means;

an accumulator, responsive to the counting end signal, for accumulating the count value of said second counting means;

switching means for selecting one of the count values held in said latch means and said accumulator, respectively; and a display, coupled to said switching means, for displaying the count value selected by said switching means.

8. The continuous counting device of claim 4, wherein said display means includes:

latch means, responsive to the counting end signal, for latching therein the count value of said second counting means;

an accumulator, responsive to the counting end signal, for accumulating the count value of said second counting means;

switching means for selecting one of the count values held in said latch means and said accumulator, respectively; and a display, coupled to said switching means, for displaying the count value selected by said switching means.

9. The continuous counting device of claim 5, wherein said display means includes:

latch means, responsive to the counting end signal, for latching therein the count value of said second counting means;

an accumulator, responsive to the counting end signal, for accumulating the count value of said second counting means;

switching means for selecting one of the count values held in said latch means and said accumulator, respectively; and a display, coupled to said switching means, for displaying the count value selected by said switching means.

10. A continuous counting device coupled to receive input signal pulses and a sampling pulse, comprising:

first means for synchronizing the input signal pulses and the sampling pulses to produce a series of synchronized sampling pulses;

second means for starting counting of the input signal pulses upon receipt of one of the synchronized sampling pulses, and for generating a trigger signal when a predetermined number of the input signal pulses have been counted;

third means for starting counting of the input signal pulses when the trigger signal is generated by said second means, the counting of said third means starting with the predetermined number and ending with the receipt of the next synchronized sampling pulse after the trigger signal is generated by said second means;

means for displaying the count value of said third means while the counting of the input signal pulses up to the predetermined number is being performed by said second means.

* * * * *

UNITED STATES PATENT AND TRADEMARK OFFICE
CERTIFICATE OF CORRECTION

PATENT NO. : 4,870,664
DATED : SEPTEMBER 26, 1989
INVENTOR(S) : MISHIO HAYASHI

It is certified that error appears in the above-identified patent and that said Letters Patent is hereby corrected as shown below:

Col. 1, line 59, "B(B-2)" should be --B(B-②)--;

line 66, "signal B-③)," should be --signal B(B-③),--.

Col. 6, line 15, "O①)" should be --O-①)--;

line 34, "waveform" should be --(waveform--.

Signed and Sealed this

Fourteenth Day of August, 1990

Attest:

HARRY F. MANBECK, JR.

*Attesting Officer*      *Commissioner of Patents and Trademarks*